US011758737B2

United States Patent
Chia

(10) Patent No.: US 11,758,737 B2
(45) Date of Patent: Sep. 12, 2023

(54) FERROELECTRIC MEMORY DEVICE AND METHOD OF FORMING THE SAME

(71) Applicant: Taiwan Semiconductor Manufacturing Co., Ltd., Hsinchu (TW)

(72) Inventor: Han-Jong Chia, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/885,303

(22) Filed: May 28, 2020

(65) Prior Publication Data

US 2021/0375890 A1 Dec. 2, 2021

(51) Int. Cl.
*H01L 21/00* (2006.01)
*H10B 53/30* (2023.01)
*H01L 49/02* (2006.01)
*H01L 29/66* (2006.01)
*H01L 21/28* (2006.01)
*H01L 21/3115* (2006.01)
*H01L 29/78* (2006.01)
*H10B 51/30* (2023.01)

(52) U.S. Cl.
CPC .......... *H10B 53/30* (2023.02); *H01L 21/3115* (2013.01); *H01L 28/60* (2013.01); *H01L 29/40111* (2019.08); *H01L 29/6684* (2013.01); *H01L 29/78391* (2014.09); *H10B 51/30* (2023.02)

(58) Field of Classification Search
CPC .......... H01L 27/11507; H01L 29/78391; H01L 29/40111; H01L 21/3115; H01L 27/1159; H01L 28/60; H01L 29/6684
See application file for complete search history.

(56) References Cited

U.S. PATENT DOCUMENTS

| | | | | |
|---|---|---|---|---|
| 6,153,898 A | * | 11/2000 | Watanabe | H01L 28/56 257/295 |
| 10,153,155 B2 | * | 12/2018 | Nishida | H01L 21/02148 |
| 2003/0102500 A1 | * | 6/2003 | Cross | H01L 28/75 257/295 |
| 2016/0372478 A1 | * | 12/2016 | Ino | H01L 27/11597 |
| 2019/0244973 A1 | * | 8/2019 | Yoo | H01L 21/02178 |
| 2020/0176610 A1 | * | 6/2020 | Lee | H01L 29/517 |
| 2020/0194591 A1 | * | 6/2020 | Kim | H01L 21/823412 |

* cited by examiner

Primary Examiner — Richard A Booth
(74) Attorney, Agent, or Firm — JCIPRNET

(57) ABSTRACT

A ferroelectric memory device includes a first conductive region, a second conductive region and a ferroelectric structure. The second conductive region is disposed over the first conductive region. The ferroelectric structure includes a plurality of different ferroelectric materials stacked between the first conductive region and the second conductive region.

15 Claims, 8 Drawing Sheets

10a

US 11,758,737 B2

FERROELECTRIC MEMORY DEVICE AND METHOD OF FORMING THE SAME

BACKGROUND

Many modern day electronic devices contain electronic memory configured to store data.

Electronic memory may be volatile memory or non-volatile memory. Volatile memory stores data while it is powered, while non-volatile memory is able to store data when power is removed. Ferroelectric random-access memory (FeRAM) devices are one promising candidate for a next generation non-volatile memory technology. This is because FeRAM devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A, FIG. 5B, FIG. 5C to FIG. 6 are schematic cross-sectional views illustrating a method of forming a ferroelectric structure according to some embodiments of the disclosure.

DETAILED DESCRIPTION

Figure 1:
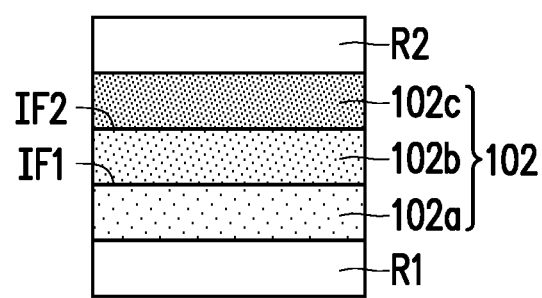
FIG. 1 is a schematic cross-sectional view illustrating a ferroelectric structure included in a memory cell according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Typically, a ferroelectric memory device uses a ferroelectric film which is composed of a single ferroelectric material. Various aspects of device performance (e.g. switching voltage, retention, endurance, etc.) of the ferroelectric memory device are highly dependent on the type of the ferroelectric material. In order to enhance the device performance (property), the ferroelectric film may be tuned. A challenge is that tuning the ferroelectric film to enhance one particular property may result in degradation of another property.

Various embodiments of the disclosure are directed to provide ferroelectric memory devices with enhanced device performance. In some embodiments, the ferroelectric memory devices use a ferroelectric structure comprised of different ferroelectric materials.

FIG. 1A is a cross-sectional view illustrating a ferroelectric structure included in a memory cell of a ferroelectric memory device according to some embodiments of the disclosure.

Referring to FIG. 1A, in some embodiments, the memory cell include a ferroelectric structure 102 disposed between a first conductive region R1 and a second conductive region R2. In some embodiments, the first conductive region R1 is a channel region of a transistor (e.g., the channel region 104 shown in FIG. 2A/2B), and the second conductive region R2 is a gate electrode of the transistor (e.g., the gate electrode 103 shown in FIG. 2A/2B). In some other embodiments, the first conductive region R1 a lower electrode connected to a transistor (e.g. the lower electrode 207/307 shown in FIG. 3A/3B/4), and the second conductive region R2 is an upper electrode (e.g., the upper electrode 208/308 shown in FIG. 3A/3B/4) over the lower electrode. In some embodiments, other components (e.g., dielectric features) may be disposed between the ferroelectric structure 102 and the first conductive region R1, and/or between the ferroelectric structure 102 and the second conductive region R2.

Figure 8A:
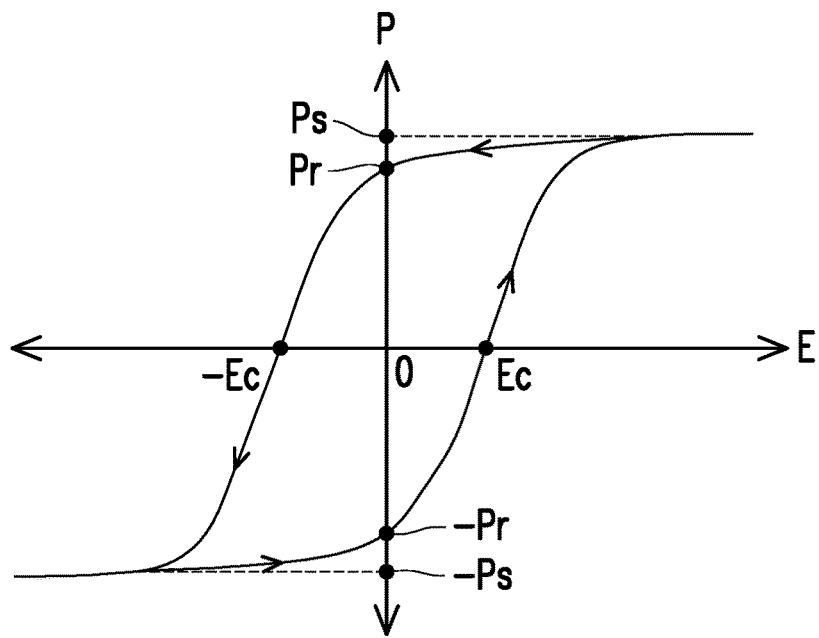
FIG. 8A and FIG. 8B schematically illustrate hysteresis loops of ferroelectric materials according to some embodiments of the disclosure.

In some embodiments, the ferroelectric structure 102 includes at least two different ferroelectric materials. In other words, the ferroelectric structure 102 is a non-homogeneous (or heterogeneous) structure. A ferroelectric material has a nonlinear relationship between the applied electric field and the stored charge. Specifically, the ferroelectric characteristic has the form of a hysteresis loop as shown in FIG. 8A, which is very similar in shape to the hysteresis loop of ferromagnetic materials. Semi-permanent electric dipoles are formed in the crystal structure of the ferroelectric material. When an external electric field is applied across the ferroelectric material, the dipoles tend to align themselves with the field direction, produced by small shifts in the positions of atoms and shifts in the distributions of electronic charge in the crystal structure. When the external electric field is removed, the dipoles of the ferroelectric material retain their polarization state.

FIG. 8A schematically illustrates a ferroelectric hysteresis loop showing the relationship between the polarization (P) versus electric field (E) of a ferroelectric material. Referring to FIG. 8A, as the electric field increased from zero to a positive value, the overall polarization of the ferroelectric material increases as the polarization in different dipolar regions (domains) are aligned with the electric field. Eventually, the total polarization of the field reaches a saturation point where the polarization is not further increased as the electric field increases since all domains are aligned in the same direction. The saturation point is called the saturation polarization (Ps) of the ferroelectric material. When the electric field is reduced to zero (i.e. the electric field is removed), the ferroelectric material retain polarized, and the polarization value at this point is called the remanent polarization (Pr). A negative field will cause the polarization to reduce, until it reaches zero at the coercive field (−Ec). A further negative increase in the electric field will eventually cause a reverse saturation polarization (−Ps) to develop. When the electric field returns to zero, the ferroelectric material is left with a negative remanent polarization (−Pr). Increasing the field once more increases the polarization from −Pr to zero at coercive field Ec, and then to Ps.

Figure 8B:
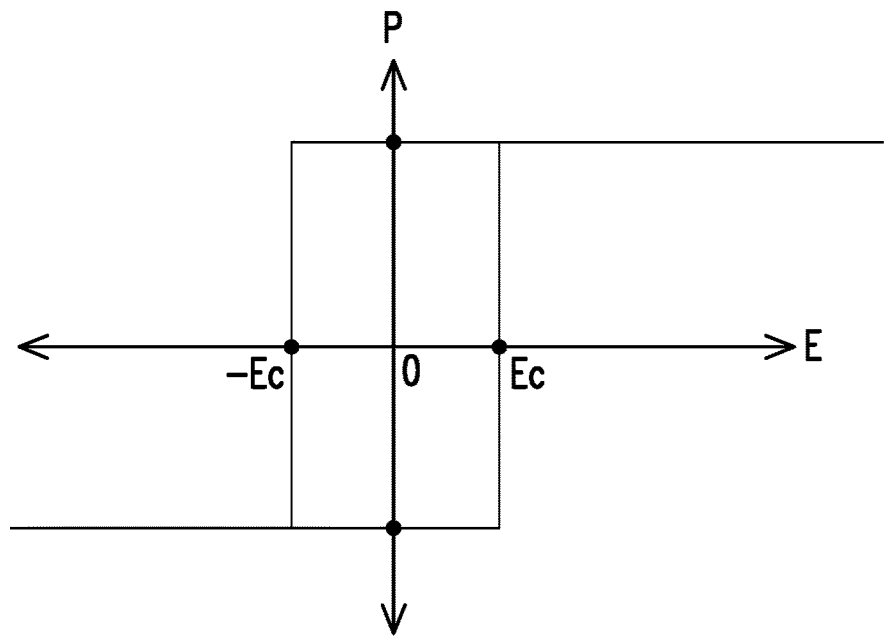

In some embodiments, different ferroelectric materials have different properties. For example, the properties may include one or more of the remanent polarization, saturation polarization, coercive field, loop squareness, voltage-pulse time, grain size, the interface property and/or other electrical properties and film growth properties. Herein, the term "loop squareness" refers to the degree of squareness of the hysteresis loop of the ferroelectric material. If the shape of the hysteresis loop is more like a square, the higher the loop squareness. For example, the loop squareness of the hysteresis loop shown in FIG. 8B is higher than the loop squareness of the hysteresis loop shown in FIG. 8A. "Voltage-pulse time" refers to the relationship between applied write pulse and required voltage to enable switching.

In some embodiments, the ferroelectric device has a product specification defining allowable and/or preferred ranges of various properties of the ferroelectric structure 102 according to product design and requirement. Different ferroelectric materials are used to tune the properties of the ferroelectric structure 102 to meet the requirements of the product specification. In some embodiments, different ferroelectric materials have different properties that are compensate with each other, such that the resulted ferroelectric structure 102 has a suitable property meeting the product design and requirement. The concept of the disclosure is to use different ferroelectric materials to compensate for any weaknesses and highlight any advantages of the materials. For example, a first ferroelectric material of the ferroelectric structure 102 may have a first property which is preferred (e.g. within the allowable or preferred range of product specification). However, a second property and/or other properties of the first ferroelectric material may be not good (e.g. out of the product specification). Then, a second ferroelectric material and/or other ferroelectric materials of the ferroelectric structure 102 may be used to compensate for the first ferroelectric material, such that all of the first property and the second property and/or other properties of the ferroelectric structure 102 are preferred and meet the requirement of product specifications.

In some embodiments, the ferroelectric structure 102 includes at least two ferroelectric layers or regions formed of different ferroelectric materials, such as three ferroelectric layers or regions. The number of ferroelectric layers included in the ferroelectric structure 102 is not limited in the disclosure, and may be adjusted according to product design and requirement. The thicknesses of the ferroelectric layers included in the ferroelectric structure 102 may be the same or different.

For example, the ferroelectric structure 102 includes a first ferroelectric layer (or region) 102a, a second ferroelectric layer 102b and a third ferroelectric layer 102c stacked between the first conductive region R1 and the second conductive region R2. In some embodiments, the ferroelectric layers 102a-102c are vertically stacked in a direction from the first conductive region R1 to the second conductive region R2. In some embodiments, more ferroelectric layers may be stacked between the conductive regions R1 and R2. The materials of the ferroelectric layers (or regions) 102a-102c are different from each other and have different properties (characteristics).

In some embodiments, the ferroelectric layers 102a-102c respectively include different ferroelectric materials selected from hafnium oxide ($HfO_x$) doped with dopant(s) such as Zr, Si, La, AlScN, $ZrO_x$, $ZrO_xPb_3Ge_5O_{11}$ (PGO), lead zircona-tetitanate (PZT), $SrBi_2Ta_2O_9$ (SBT or SBTO), $SrB_4O_7$ (SBO), $Sr_aBi_bTa_cNb_dO)_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, hafnium silicate, HfAlO, LaAlO, lanthanum oxide, $Ta_2O_5$, and/or other suitable ferroelectric material.

In some embodiments, the adjacent two ferroelectric layers of the ferroelectric structure 102 have an interface therebetween. For example, an interface IF1 is existed between the first ferroelectric layer 102a and the second ferroelectric layer 102b, and an interface IF2 is existed between the second ferroelectric layer 102b and the third ferroelectric layer 102c. In some embodiments, the ferroelectric structure 102 includes ferroelectric regions 102a-102c having different ferroelectric materials, and the boundaries between two adjacent ferroelectric regions may include two or more different ferroelectric materials.

In some embodiments, the ferroelectric structure 102 may include hafnium oxide ($HfO_x$) doped with different dopants. The dopants may include various metallic dopants and/or semiconductor dopants. In some embodiments, the dopants may be selected from two or more of La, Zr, Si, Al, or the like and/or other suitable dopants. For example, the ferroelectric structure 102 includes $HfO_x$ doped with a first dopant, a second dopant and a third dopant that are different from each other. The first dopant may be concentrated in a bottom portion (e.g., the first ferroelectric region 102a) of the ferroelectric structure 102. The second dopant may be concentrated in a middle portion (e.g., the second ferroelectric region 102b) of the ferroelectric structure 102. The third dopant may be concentrated in a third portion (e.g. the third ferroelectric region 102c) of the ferroelectric structure 102. In some embodiments, the first dopant exists in the boundary between the ferroelectric regions 102a and 102b, and may also be (e.g. lightly) doped in the ferroelectric region 102b and/or 102c. The second dopant may exist in the boundary between the ferroelectric regions 102a and 102b, and/or in the boundary between the ferroelectric regions 102b and 102c, and/or further be (e.g. lightly) doped in the ferroelectric region 102a and/or 102c. The third dopant may exist in the boundary between the ferroelectric regions 102b and 102c, and may further be (e.g. lightly) doped in the ferroelectric regions 102a and/or 102b.

In some other embodiments, the ferroelectric layer 102a includes $HfO_x$ doped with the first dopant, the ferroelectric layer 102b includes $HfO_x$ doped with the second dopant, and the ferroelectric layer 102c includes $HfO_x$ doped with the third dopant. The first dopant may be not included in the ferroelectric layers 102b and 102c, the second dopant may be not included in the ferroelectric layers 102a and 102c, and the third dopant may be not included in the ferroelectric layers 102a and 102b.

The ferroelectric layers (or regions) 102a-102c have different properties due to different ferroelectric materials. Through using different ferroelectric materials with different properties to form the ferroelectric structure 102, the ferroelectric structure 102 may have a suitable/preferred property, such that the ferroelectric memory device including the ferroelectric structure 102 has enhanced device performance (e.g. retention, endurance, switching voltage, etc.).

In an illustrative embodiment, the first ferroelectric layer 102a includes AlScN, the second ferroelectric layer 102b includes HfZO, and the third ferroelectric layer 102c includes HfSiO. The AlScN is known to result in square PV loops. The HfZO and HfSiO can be mixed to yield desired Pr and Ec values.

Still referring to FIG. 1, in some illustrative embodiments, the ferroelectric structure 102 includes two ferroelectric layers formed of different ferroelectric materials. For example, the ferroelectric structure 102 may include the lower ferroelectric layer/region 102a and the upper ferroelectric layer/region 102c, while the ferroelectric layer 102b may be omitted. Some examples of combining two different ferroelectric materials are provided below for illustration.

In some embodiments, in order to tune the properties (electrical properties and/or film growth properties) of the ferroelectric structure 102 to enhance the device performance, the ferroelectric layers 102a and 102c may be formed of ferroelectric materials that are different in one or more of the following properties: remanent polarization (Pr), saturation polarization (Ps), coercive field (Ec), loop squareness, voltage-pulse time, grain size, the interface property between the ferroelectric material and conductive or dielectric layer.

For example, according to the product specification design, a polarization value (e.g. Pr or Ps) and a coercive field the ferroelectric structure 102 are needed to be a certain value or within a certain range, which may be referred to as a target polarization value and a target coercive field. In order to achieve the target polarization value and the target coercive field, ferroelectric materials having different polarization values and coercive fields may be used to tune the property of the ferroelectric structure 102. For example, one of the lower and upper ferroelectric layers 102a and 102c may include a ferroelectric material having a polarization value larger than the target polarization value and/or a coercive field larger than the target coercive field, while the other one of the lower and upper ferroelectric layers 102a and 102c may include a ferroelectric material having a polarization value less than the target polarization value and/or a coercive field lower than the target coercive field. As such, by using the combination of the ferroelectric layers 102a and 102c, the ferroelectric structure 102 may achieve the target polarization value and target coercive field. As an example, a combination of hafnium oxide doped with Zr (Hf(Zr)O) having higher polarization and higher coercive field and hafnium oxide doped with Al (Hf(Al)O) having lower polarization and lower coercive field may be used for the ferroelectric structure 102 to achieve the target polarization value and coercive filed. In other words, one of the ferroelectric layers 102a and 102c may include Hf(Al)O, and the other one of the ferroelectric layers 102a and 102c may include Hf(Zr)O.

In another illustrative embodiment in which the ferroelectric layer 102b is omitted, one of the ferroelectric layers 102a and 102c include a first ferroelectric material having a high loop squareness, which will result in better write switching distribution and endurance. However, the Pr of the first ferroelectric material is low, which is detrimental for read and poor for retention of in the memory device. In such an embodiment, the other one of the ferroelectric layers 102a and 102c may use a second ferroelectric material which may have relatively poor loop squareness but high Pr. As such, the resulted ferroelectric structure 102 may have good loop squareness and moderately high Pr. Therefore, the weakness of the ferroelectric materials is compensated and advantages of the ferroelectric materials are highlighted.

In yet another illustrative embodiment, in order to enable small lateral sized ferroelectric cells for advanced nodes, it is expected to shrink the grain size of ferroelectric structure as much as possible. However, a ferroelectric material that has small grains may have poor electrical properties (such as low Pr). In some embodiments, one of the ferroelectric layers 102a and 102c uses a first ferroelectric material with small grains, and the other one of the ferroelectric layers 102a and 102c uses a second ferroelectric material having relatively larger grains but desirable electrical properties (e.g. high Pr). In other words, the grain size of the second ferroelectric material is larger than that of the first ferroelectric material, and the Pr value of the second ferroelectric material is higher than that of the first ferroelectric material. As such, the ferroelectric structure 102 may have relatively small grains and moderately high Pr.

Interface property of a ferroelectric material refers to the property of the interface between the ferroelectric material and adjacent material. For example, when a ferroelectric material is disposed adjacent to a metal material, if the ferroelectric material is readily reacted with the metal material under thermal treatment or the metal is easy to diffuse into the ferroelectric material, which may negatively affect the electrical property of the ferroelectric material, then the interface between such ferroelectric material and metal material may be called unclear interface, and interface property of the ferroelectric material is poor. In contrast, if a ferroelectric material is not readily reacted with metal material under thermal treatment and the metal material is not easy to diffuse into the ferroelectric material, then the interface between the ferroelectric material and metal material may be called clear/clean interface, and the interface property of the ferroelectric material is good, such kind of the ferroelectric material may be used as a metal diffusion barrier layer.

On the other hand, when a ferroelectric material is disposed adjacent to an insulating material (such as native oxide), if the insulating material is readily generates a depolarization filed under the affection of the ferroelectric material, it represents the ferroelectric material has poor interface property. On the contrast, if the insulating material is not readily to generate a depolarization filed when interfacing with or adjacent to the ferroelectric material, it represents the ferroelectric material has good interface property.

Therefore, considering the interface property, the ferroelectric material having good interface properties may be selected to be disposed adjacent to the metal material or insulating material, while the ferroelectric material having poor interface properties may be disposed farther from the metal material or insulating material, such as disposed in the middle portion of the ferroelectric structure.

For example, as shown in FIG. 1, ferroelectric materials having good interface properties may be selected to form the first ferroelectric layer 102a and the third ferroelectric layer 102c, while another ferroelectric material may be selected to form the second ferroelectric layer 102b. In some embodiments, the second conductive region R2 includes Ru, the third ferroelectric layer 102c may utilize a ferroelectric material which has a good interface property and disposed next to the second conductive region R2. The third ferroelectric layer 102c serves as a diffusion barrier layer for preventing the metal (i.e. Ru) diffusion from the second conductive region R2 to the ferroelectric structure 102. Blocking out metal diffusion will better enable high orthorhombic crystalline phase which is needed for good ferroelectric properties in hafnium oxide based ferroelectrics. In such embodiments, the first and second ferroelectric layers 102a and 102b may be different ferroelectric materials that aren't necessarily a good metal diffusion barrier but is known to yield other suitable properties (e.g., Ec and Pr) needed for product specification. In alternative embodiments, the second conductive region R2 may include titanium nitride (TiN), and $Hf_{0.5}Zr_{0.5}O_2$ (HZO) having good interface property may be used to form the third ferroelectric layer 102c, so as to yield good electrical property (e.g. good Pr). While the ferroelectric layers 102a and 102b may utilize different ferroelectric materials which do not necessarily have good interface property but have suitable electrical properties and/or grain sizes, such that the overall property of the ferroelectric structure 102 is tuned to meet required product specifications.

The ferroelectric structure 102 may be applied in various types of ferroelectric memory devices. FIGS. 2A, 2B, 3A, 3B, and 4 are schematic cross-sectional views illustrating memory devices including the ferroelectric structure 102 according to some embodiments of the disclosure.

Figure 2A:
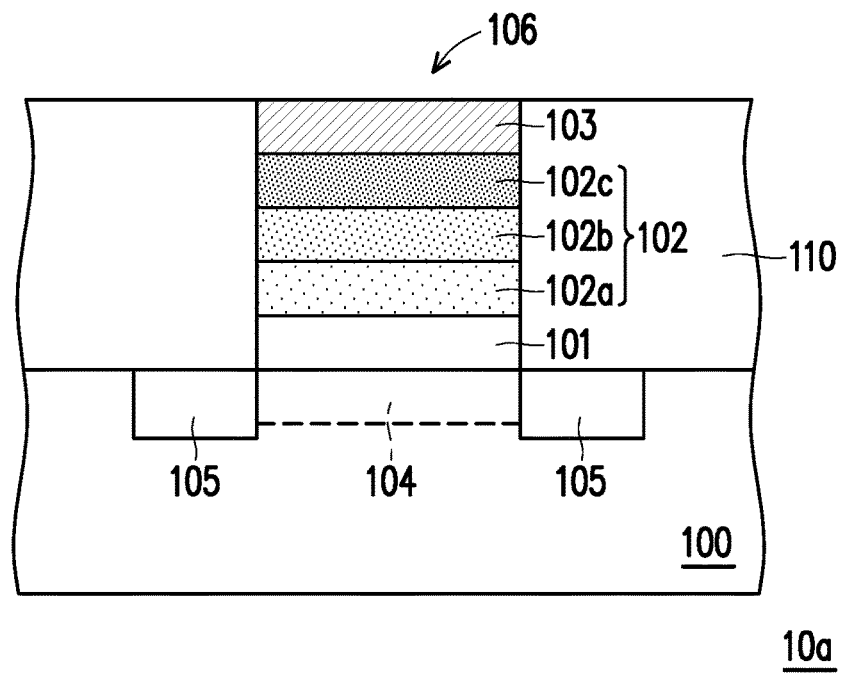
FIG. 2A, FIG. 2B, FIG. 3A, FIG. 3B, and FIG. 4 are schematic cross-sectional views of ferroelectric memory devices according to some embodiments of the disclosure.

Referring to FIG. 2A, the illustrated ferroelectric memory device 10a is a metal-ferroelectric-insulator-semiconductor (MFIS) ferroelectric memory device. In some embodiments, the ferroelectric memory device 10 includes a transistor 106, and the ferroelectric structure 102 is embedded in the transistor 106. The transistor 106 may also be referred to as ferroelectric field effect transistor (FeFET).

In some embodiments, the ferroelectric memory device 10a includes a substrate 100 and a ferroelectric field-effect transistor (FeFET) transistor 106 on the substrate 100. The transistor 106 includes an insulating layer 101, a ferroelectric structure 102 and a gate electrode 103 stacked on the substrate 100 and source/drain (S/D) regions 105. Source/drain (S/D) regions 105 are disposed in the substrate 100 and on sides of the gate electrode 103. A channel region 104 is formed between the S/D regions 105 and underlying the gate electrode 103 and ferroelectric structure 102.

In some embodiments, the substrate 100 is made of silicon and/or other semiconductor materials. Alternatively or additionally, the substrate 100 includes other elementary semiconductor materials such as germanium, gallium arsenic, or other suitable semiconductor materials. In some embodiments, the substrate 100 may further include other features such as various doped regions, buried layer(s), and/or epitaxy layer(s). Moreover, in some embodiments, the substrate 100 is made of an alloy semiconductor such as silicon germanium, silicon germanium carbide, gallium arsenic phosphide, or gallium indium phosphide. Furthermore, the substrate 100 may be a semiconductor on insulator such as silicon on insulator (SOI) or silicon on sapphire.

The insulating layer 101, the ferroelectric structure 102 and the gate electrode 103 are sequentially stacked on the channel region 104 of the substrate 100. In some embodiments, the combination of the insulating layer 101 and the ferroelectric structure 102 may be referred to as a gate dielectric layer. The insulating layer 101 may include silicon oxide, silicon nitride, silicon oxynitride, a high-K dielectric material, or the like, or combinations thereof. The high-k dielectric material may have a dielectric constant such as greater than about 4, or greater than about 7 or 10.

In some embodiments, the high-k dielectric material includes $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, combinations thereof, or other suitable material. In some embodiments, a native oxide layer (e.g. silicon oxide, not shown) may be exist between the insulating layer 101 and the substrate 10a. In some other embodiments, the insulating layer 101 is optically formed and may be omitted. If the insulating layer 101 is omitted, the ferroelectric memory device 10a may be referred to as metal-ferroelectric-semiconductor (MFS) ferroelectric memory device.

The gate electrode 103 may include polysilicon and/or metallic materials. In some embodiments, the gate electrode layer 103 includes a work function metal layer and a metal layer on the work function metal layer. The work functional metal layer is configured to tune the work function of the transistor to achieve a desired threshold voltage Vt. The work function metal layer maybe an N-type work function metal layer or a P-type work function metal layer. In some embodiments, the P-type work function metal layer includes a metal with a sufficiently large effective work function and may include one or more of the following: TiN, WN, TaN, conductive metal oxide, and/or other suitable material, or combinations thereof. In alternative embodiments, the N-type work function metal layer includes a metal with sufficiently low effective work function and may include one or more of the following: tantalum (Ta), titanium aluminide (TiAl), titanium aluminum nitride (TiAlN), tantalum carbide (TaC), tantalum carbide nitride (TaCN), tantalum silicon nitride (TaSiN), titanium silicon nitride (TiSiN), other suitable metals, suitable conductive metal oxide, or combinations thereof. The metal layer may include copper, aluminum, tungsten, cobalt (Co), or any other suitable metallic material, or the like or combinations thereof.

In the present embodiment, the ferroelectric structure 102 is disposed between channel region 104 (i.e. the first conductive region R1 of FIG. 1) and the gate electrode 103. The composition and structural features of the ferroelectric structure 102 has been described in FIG. 1, which are not described again here.

The S/D regions 105 may be doped regions including p-type dopants, such as boron, $BF_2^+$, and/or a combination thereof. Alternatively, the S/D regions 105 may be doped regions including n-type dopants, such as phosphorus, arsenic, and/or a combination thereof. In some embodiments, the S/D region 105 may also include an epitaxial layer (or strained layer).

In some embodiments, the gate stack including the insulating layer 101, the ferroelectric structure 102 and the gate electrode 103 are formed by various deposition processes and patterning processes. The S/D regions 105 may be formed by doping process and/or epitaxial process.

In some embodiments, an interlayer dielectric layer (ILD) 110 is disposed on the substrate 100 and covering the transistor 106. An interconnection structure (not shown) may be disposed over the interlayer dielectric layer 110 and electrically coupled to the transistor 106. In some embodiments, the ILD 108 is formed after the formation of gate stack.

In the ferroelectric memory device 10a, the ferroelectric structure 102 has polarization characteristics in accordance with a voltage applied through the gate electrode 103, and a conductive region (i.e. the channel region 104) is formed between the S/D regions 105. As a result, a current flows between the S/D regions 105. When the voltage applied through the gate electrode is cut off, the polarization characteristics of the ferroelectric structure 103 is continuously maintained.

Figure 2B:
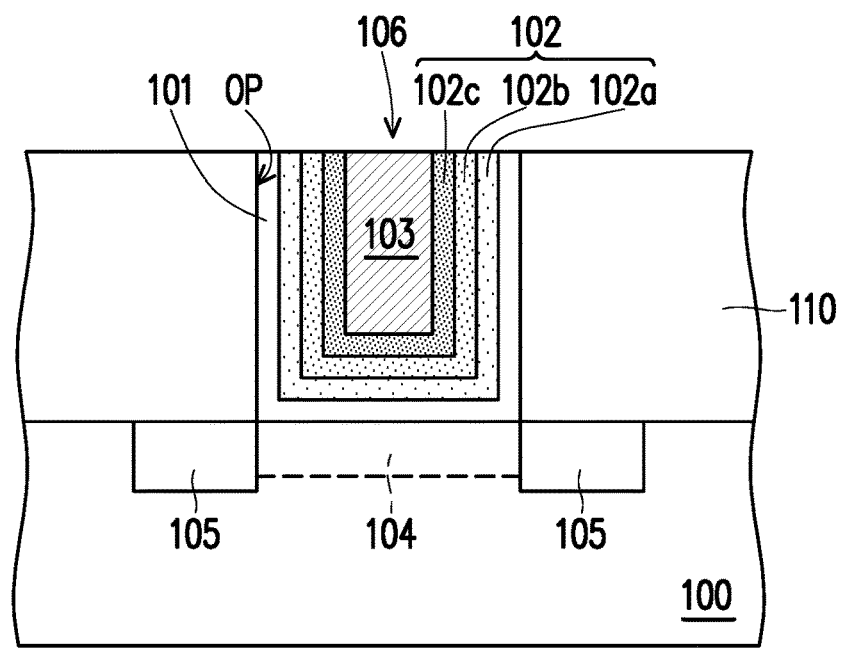

FIG. 2B is a schematic cross-sectional view illustrating a memory device 10b according to alternative embodiments of the disclosure. The memory device 10b is similar to the memory device 10a, except that the gate stack is formed after the formation of interlayer dielectric layer 110.

Referring to FIG. 2B, in some embodiments, the gate stack (i.e. the insulating layer 101, the ferroelectric structure 102 and the gate electrode 103) is formed in an opening OP of the dielectric layer 110. For example, the gate stack may be formed by a gate replacement process. In some embodiments, the ferroelectric structure 102 and/or the insulating layer 101 may be U-shaped. The ferroelectric structure 102 may be disposed between the gate electrode 103 and the substrate 100, and laterally between the gate electrode 103 and the dielectric layer 110. The ferroelectric structure 102 may wrap around the sidewalls and bottom surface of the gate electrode 103. The characteristic of the ferroelectric structure 102 may be substantially similar to those described in the foregoing embodiment, which are not described again here.

During operation of the ferroelectric memory devices 10a and 10b, bias voltages may be applied to the gate electrode 103 and/or one or more of the S/D regions 105. For example, in some embodiments, bias voltages may be applied to the gate electrode 103 and both of the S/D regions 105, while in other embodiments, bias voltages may be applied to the gate electrode 103 and one of the S/D regions 105 and not to the other one of the S/D regions 105. The bias voltages allow for data states to be written to and/or read from and/or erase from the ferroelectric memory device 10a/10b. For example, during a write operation, one or more bias voltages may be applied on the gate electrode 103 and/or the S/D region(s) 105 to cause charge carriers (e.g., electrons and/or holes) to accumulate between the S/D regions 105. The charge carriers generate electric fields, which extend through the ferroelectric structure 102. The electric fields are configured to change positions of electric dipoles within the ferroelectric structure 102 depending on the bias voltages. If the polarization of the ferroelectric structure 102 has a first polarization on a specific bias voltage, the ferroelectric memory device 10b will digitally store data as a first bit value (e.g., a logical "0").

Alternatively, if the polarization of the ferroelectric structure 102 has a second polarization on a different bias voltage from the former, the ferroelectric memory device 102 will digitally store data as a second bit value (e.g., a logical "1").

Figure 3A:
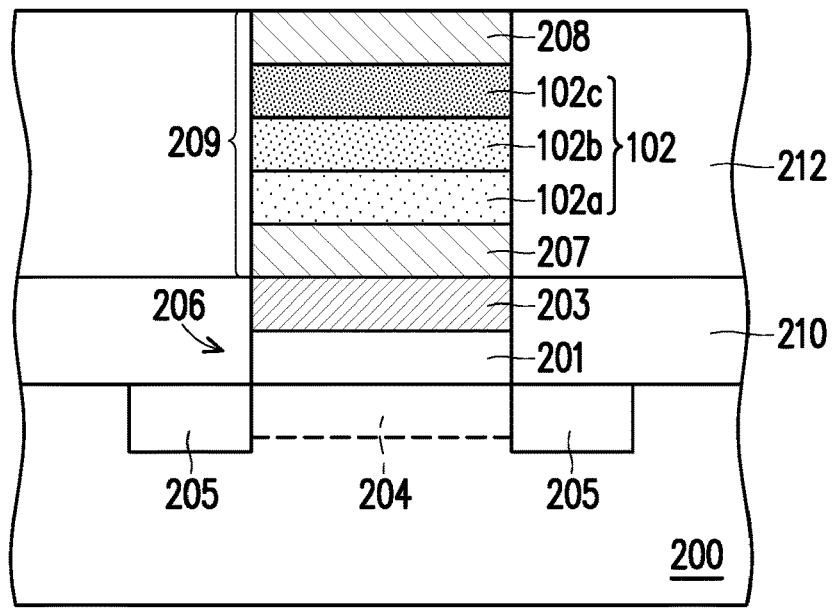

FIG. 3A is a cross-sectional view illustrating a ferroelectric memory device 20a according to alternative embodiment of the disclosure.

Referring to FIG. 3A, the ferroelectric memory device 20a is a metal-ferroelectric-metal-insulator-semiconductor (MFMIS) type ferroelectric memory device. The ferroelectric memory device 20a may include a substrate 200, a transistor 206 disposed on and/or in the substrate 200, and a ferroelectric capacitor 209 connected to the transistor 206. Dielectric layers 210 and 212 are disposed laterally aside the gate stack of the transistor 206 and the ferroelectric capacitor 209. The transistor 206 includes an insulating layer 201 and a gate electrode 203 disposed on the substrate 200, and S/D regions 205 in the substrate 200 and on opposite sides of the gate electrode 203. A channel region 204 is formed between the S/D regions 205 and underlying the gate electrode 203. In some embodiments, the ferroelectric capacitor 209 is disposed over the transistor 206 and includes a lower electrode 207, a ferroelectric structure 102 and an upper electrode 208. The ferroelectric capacitor 209 is disposed on and electrically coupled to the gate electrode 203 of the transistor 206. The ferroelectric structure 102 is disposed between the lower electrode 207 (corresponding to the first conductive region R1 shown in FIG. 1) and the upper electrode 208 (corresponding to the second conductive region R2 shown in FIG. 2). The materials of the lower electrode 207 and upper electrode 208 may be respectively selected from a group consisting of aluminum (Al), titanium (Ti), copper (Cu), tungsten (W), platinum (Pt), palladium (Pd), osmium (Os), ruthenium (Ru), tantalum (Ta), or an alloy thereof, titanium nitride (TiN), tantalum nitride (TaN), tungsten nitride (WN), molybdenum nitride (MoN), TaSiN, TiSiN, WSiN, tungsten silicide, titanium silicide, cobalt silicide, zirconium silicide, platinum silicide, molybdenum silicide, copper silicide, nickel silicide, indium tin oxide (ITO), iridium oxide ($IrO_2$), rhenium oxide ($ReO_2$), rhenium trioxide ($ReO_3$), or a combination thereof.

In some embodiments, the gate electrode 203 is electrically connected to the lower electrode 207 of the ferroelectric capacitor 209 and may work as a floating gate of the memory device 20a. In some embodiments, the gate electrode 203 may be omitted, and the lower electrode 207 serves as the floating gate. The upper electrode 208 of the ferroelectric capacitor 209 may function as or electrically connected to a control gate (not shown) of the ferroelectric memory device 20a.

In the present embodiment, the lower electrode 207 of the ferroelectric capacitor 209 is disposed directly on and in contact with the gate electrode 203. In some embodiments, the width of the ferroelectric capacitor 209 may be substantially the same as the gate stack (i.e. the insulating layer 201 and the gate electrode 203) of the transistor 206. The width of the ferroelectric structure 102 may be substantially the same as the width of the gate electrode 203. However, the disclosure is not limited thereto. In alternative embodiments, the width of the ferroelectric structure 102 may be different from (such as less than) the width of the gate stack of the transistor 206.

Figure 3B:
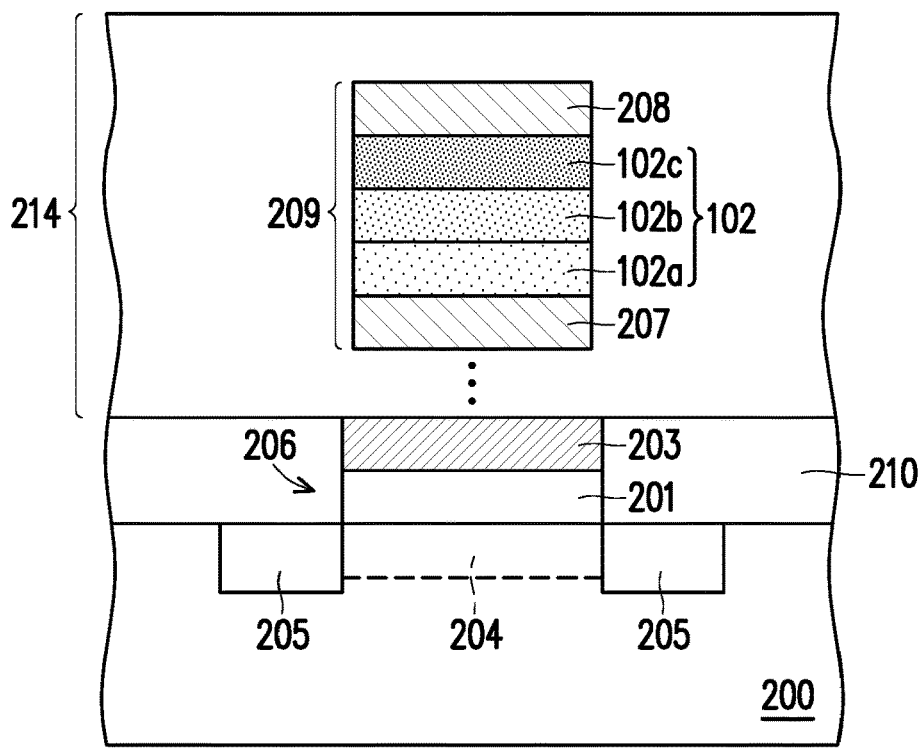

FIG. 3B illustrates a ferroelectric memory device 20b which is a variation of the memory device 20a. Referring to FIG. 3B, in some embodiments, the lower electrode 207 of the ferroelectric capacitor 209 may not be in direct contact with the gate electrode 203. For example, the ferroelectric capacitor 209 may be disposed in an interconnection structure 214 over the gate electrode 203 and formed in back-end-of-line (BEOL) process. The interconnection structure 214 may include a plurality of dielectric layers, and a plurality of conductive features (e.g. conductive vias and/or conductive lines) formed in the dielectric layers and interconnected to each other. The conductive features may be electrically connected to the transistor 206. The ferroelectric capacitor 209 may be embedded in the dielectric layers of the interconnection structure 214, and the lower electrode 207 of the ferroelectric capacitor 209 may be electrically connected to the gate electrode 203 through one or more conductive via(s) and/or conductive line(s). In some embodiments, the lower electrode 207 and the upper electrode 208 of the ferroelectric capacitor 209 may be formed simultaneously with the M (M≥1) layer of conductive layers and M+1 layer of conductive layers of the interconnection structure 214.

In the ferroelectric memory devices 20a and 20b, the ferroelectric structure 102 is polarized using the lower electrode 207 and the upper electrode 208 in order to write data (e.g. "0" or "1") in the ferroelectric structure 102. When the ferroelectric structure 102 is polarized, the transistor 206 is set to either ON or OFF state according to the polarization state (corresponding to the written data "0" or "1") of the ferroelectric structure 102. Accordingly, the written data "0" or "1" may be read based on the drain current of the transistor 206.

Figure 4:
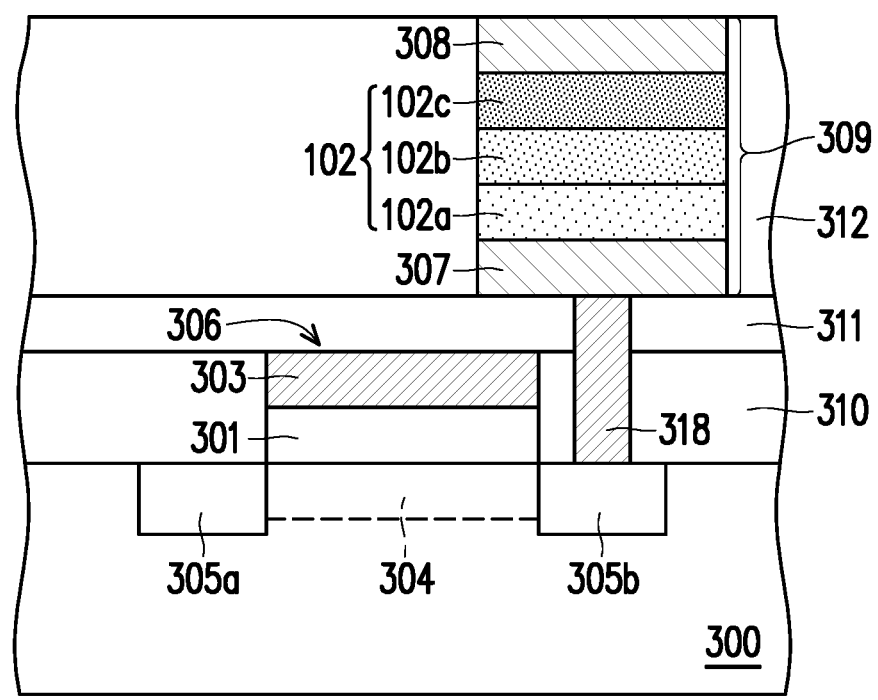

FIG. 4 is a cross-sectional view illustrating a ferroelectric memory device 30 which is a 1 transistor-1 capacitor (1T-1C) type ferroelectric memory device.

Referring to FIG. 4, in some embodiments, the ferroelectric memory device 30 includes a substrate 300, a transistor 306 disposed on and/or in the substrate 300 and a ferroelectric capacitor 309 electrically connected to the transistor 306. The structure and materials of the substrate 300, the transistor 306 and the ferroelectric capacitor 309 are substantially similar to those of the memory device 20a/20b, the difference lies in that the ferroelectric capacitor 309 is electrically connected to the drain region of the transistor 306. In some embodiments, the transistor 306 includes a gate dielectric layer 301 and a gate electrode 303 on the substrate 300, a source region 305a and a drain region 305b in the substrate 300 and on sides of the gate electrode 303. The ferroelectric capacitor 309 is electrically connected to the drain region 305b of the transistor 306 through a conductive plug/via 318. In some embodiments, a first ILD 310 is disposed on the substrate 300 and laterally aside the gate electrode 303 and the gate dielectric layer 301. A second ILD 311 is disposed on the first ILD 310 and covering top surface of the gate electrode 303. The conductive plug 318 penetrates through the ILDs 311 and 310 to electrically connect to the drain region 305b of the transistor 306. A dielectric layer 312 may be disposed on the second ILD 311 and laterally aside the ferroelectric capacitor 309. In some embodiments, the ferroelectric capacitor 309 is embedded in an interconnection structure (similar to the interconnection structure 214 shown in FIG. 3B) over the transistor 306. In some other embodiments, the ferroelectric capacitor 309 may be connected to the drain region 305 through more than one conductive plug and/or conductive lines.

The applications of the ferroelectric structure 102 described above are merely for illustration, and the disclosure is not limited thereto. In some other embodiments, the ferroelectric structure 102 may also be applied in other kind of ferroelectric devices using ferroelectric materials, such as negative capacitance field effect transistors (NCFET).

FIG. 5A to FIG. 5C and FIG. 6 are schematic cross-sectional views illustrating a method of forming the ferroelectric structure 102 according to some embodiments of the disclosure.

Figure 5A:
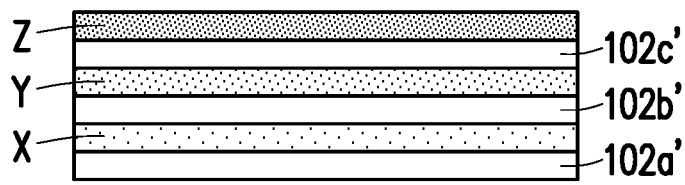
Figure 5B:
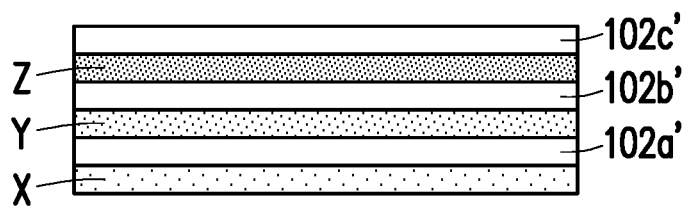
Figure 5C:
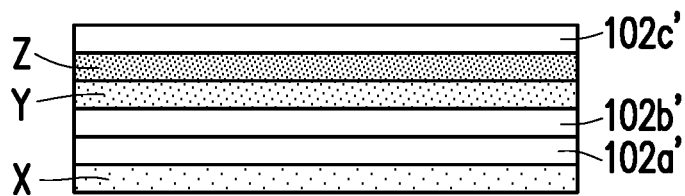

Referring to FIG. 5A to FIG. 5C, in some embodiments, a plurality of ferroelectric material layers (e.g. 102a', 102b', 102c') and a plurality of dopant layers (e.g. X, Y, Z) are stacked from bottom to top over a substrate (e.g. the substrate 100-300 shown in FIG. 1 to FIG. 3). The ferroelectric materials 102a', 102b', 102c' and dopant layers X, Y, Z may be formed by suitable deposition processes, such as chemical vapor deposition (CVD), atomic layer deposition (ALD), physical vapor deposition (PVD), or the like or combinations thereof. The materials of the plurality of ferroelectric material layers 102a', 102b', 102c' may be the same or different. In some embodiments, the materials of dopant layers X, Y, Z are different from each other. The dopant layers X, Y, Z correspond to different dopants x, y, z that are to be doped into the ferroelectric material layers. In some embodiments, the ferroelectric material layers 102a', 102b', 102c' include the same ferroelectric material, such as hafnium oxide ($HfO_x$), but the disclosure is not limited thereto. The dopant layers X, Y, Z may be respectively selected from a group consisting of Si, Zr, La, Al, or the like and/or other suitable dopants.

The ferroelectric materials 102a' to 102c' and dopant layers X, Y, Z may be stacked in any suitable order. Some examples of the stacking of the layers 102a' to 102c' and X, Y, Z are illustrated in FIG. 5A to FIG. 5C.

In some embodiments, as shown in FIG. 5A, the ferroelectric material layer 102a' to 102c' and dopants layers X, Y, Z are alternatively stacked. In detail, the ferroelectric material layer 102a', the dopant layer X, the ferroelectric material layer 102b', the dopant layer Y, the ferroelectric material layer 102c', the dopant layer Z are sequentially stacked from bottom to top. In alternative embodiments, as shown in FIG. 5B, the dopant layer X, the ferroelectric material layer 102a', the dopant layer Y, the ferroelectric material layer 102b', the dopant layer Z and the ferroelectric material layer 102c' are sequentially stacked from bottom to top. In yet another embodiment, as shown in FIG. 5C, the dopant layer X, the ferroelectric material layers 102a' and 102b', the dopant layers Y and Z and the ferroelectric material layer 102c' are sequentially stacked from bottom to top.

It is understood that the number of ferroelectric material layers and the dopant layers, and the stacking order of the layers shown in FIG. 5A to FIG. 5C are merely for illustration, and the disclosure is not limited thereto. More or less ferroelectric material layers and dopant layers may be formed in any suitable stacking order to form the ferroelectric structure 102.

Referring to FIG. 5A to FIG. 5C and FIG. 6, after the layers are stacked upon one another, an annealing process is performed on the stacked layers, such that the dopants x, y, z diffuse into the ferroelectric material layers 102a'-102c' to form doped ferroelectric layers (or regions) 102a-102c. As such, the ferroelectric structure 102 including the ferroelectric layers 102a-102c is formed. In some embodiments, the ferroelectric structure 102 may include hafnium oxide doped with different dopants x, y, z. The ferroelectric structure 102 may be a non-homogeneous (or heterogeneous) structure, and the distribution of the dopants x, y, z in the ferroelectric structure 102 may be related to the stacking order of the layers before the annealing process.

In some embodiments (e.g. FIG. 5B/5C to FIG. 6), the dopant X may be mainly doped into the first ferroelectric material layer 102a'. In alternative embodiments (e.g. FIG. 5A), the dopant X may be mainly doped into the first ferroelectric layer 102a' and the second ferroelectric layer 102b'. In some embodiments, the dopant X may be also doped into the third ferroelectric layer 102c'. The dopant Y may be mainly doped into the second ferroelectric material layer 102b' (e.g. in the embodiment of FIG. 5C to FIG. 6). Alternatively, the dopant Y may be mainly doped into the second and third ferroelectric material layers 102b' and 102c' (e.g. in the embodiment of FIG. 5A and FIG. 5B to FIG. 6). Additionally, the dopant Y may also be doped into the first ferroelectric layer 102a'. The dopant Z may be mainly doped into the third ferroelectric layer 102c' (e.g. in the embodiment of FIG. 5A and FIG. 5C to FIG. 6). Alternatively, the dopant Z may be mainly doped into the third ferroelectric layer 102c' and the second ferroelectric material layer 102b' (e.g. in the embodiment of FIG. 5B to FIG. 6). Additionally, the dopant Z may also be doped into the first ferroelectric layer 102a'.

Figure 6:
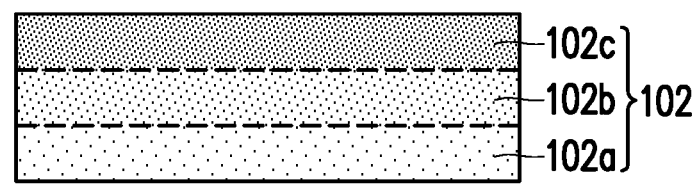

Referring to FIG. 6, the ferroelectric structure 102 includes ferroelectric layers (or regions) 102a, 102b, 102c. In some embodiments, each of the dopants x, y, z may be included in one or more of the ferroelectric layers 102a-102c. For example, the dopant x may be concentrated in the lower portion (i.e. the ferroelectric region 102a) of the ferroelectric structure 102, the dopant y may be concentrated in the middle portion (i.e. the ferroelectric region 102b) of the ferroelectric structure 102, while the dopant z may be concentrated in the upper portion (i.e. the ferroelectric region 102c) of the ferroelectric structure 102. The dopant x may also be included in the boundary between the ferroelectric regions 102a and 102b and/or doped (e.g. lightly doped) in the ferroelectric regions 102b and/or 102c. The dopant y may also be included in the boundary between the ferroelectric regions 102a and 102b, in the boundary between the ferroelectric regions 102b and 102c, and/or doped (e.g. lightly doped) in the ferroelectric regions 102a and 102c. The dopant z may also be included in the boundary between the ferroelectric regions 102b and 102c, and/or doped (e.g. lightly doped) in the ferroelectric regions 102a and 102b. In other words, the concentration of the dopant x in the ferroelectric layer 102a may be larger than the concentration of the dopant x in the ferroelectric layer 102b and/or in the ferroelectric layer 102c, the concentration of the dopant y in the ferroelectric layer 102b may be larger than the concentration of dopant y in the ferroelectric layer 102a and/or in the ferroelectric layer 102c, the concentration of the dopant z in the ferroelectric layer 102c may be larger than the concentration of the dopant z in the ferroelectric layer 102a and/or in the ferroelectric layer 102b. However, the disclosure is not limited thereto.

FIG. 7A to FIG. 7F are cross-sectional views illustrating a method of forming the ferroelectric structure 102 according to alternative embodiment of the disclosure.

Figure 7A:
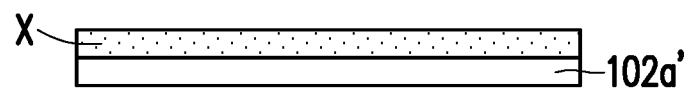
FIG. 7A to FIG. 7F are schematic cross-sectional views illustrating a method of forming a ferroelectric structure according to alternative embodiments of the disclosure.

Referring to FIG. 7A, in some embodiments, a first ferroelectric material layer 102a' is formed, and a first dopant layer X is formed on the first ferroelectric material layer 102a'. In some other embodiments, the first dopant layer X may be formed before forming the first ferroelectric material layer 102a', and the first ferroelectric material layer 102a' is formed on the first dopant layer X.

Figure 7B:
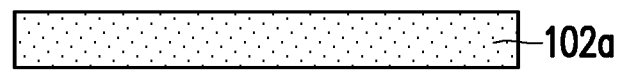

Referring to FIG. 7B, an annealing process is then performed on the first ferroelectric material layer 102a' and the first dopant layer X, so as to induce the dopant x into the first ferroelectric material layer 102a', and a first doped ferroelectric layer 102 is thus formed.

Figure 7C:
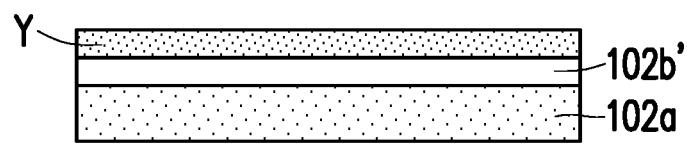
Figure 7D:
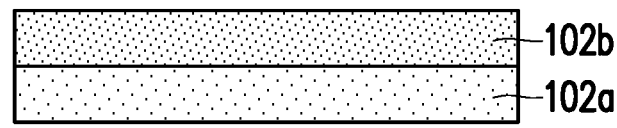

Referring to FIG. 7C and FIG. 7D, a second ferroelectric material layer 102b' and a second dopant layer Y are formed on the first ferroelectric layer 102a. The second ferroelectric material layer 102b' may be formed before or after the formation of the second dopant layer Y. Thereafter, an annealing process is performed to induce the dopant y into the second ferroelectric material layer 102b', and a second ferroelectric layer 102b is formed on the first ferroelectric layer 102a.

Figure 7E:
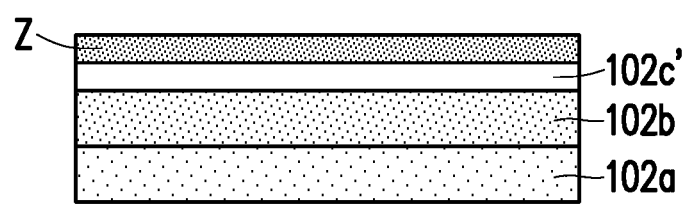
Figure 7F:
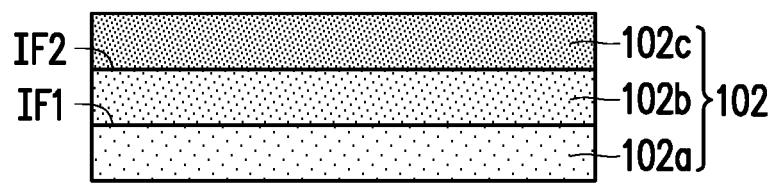

Referring to FIG. 7E and FIG. 7F, a third ferroelectric material layer 102c' and a third dopant layer Z are formed on the second ferroelectric layer 102b, and an annealing process is performed to induce the dopant z into the third ferroelectric material layer 102c', and a third ferroelectric layer 102c is formed on the second ferroelectric layer 102b.

In such embodiment, the annealing process is separately performed after the formation of each combination of ferroelectric material layer and dopant layer, interfaces may be formed between adjacent two ferroelectric layers. For example, an interface IF1 is existed between the first ferroelectric layer 102a and the second ferroelectric layer 102b, and an interface IF2 is existed between the second ferroelectric layer 102b and the third ferroelectric layer 102c.

The above-described methods utilize annealing process to induce dopant into ferroelectric material, but the disclosure is not limited thereto. In alternative embodiments, implanting/doping processes may be used to form doped ferroelectric layers. For example, a first ferroelectric material layer is formed, and a first implanting process is performed to implant a first dopant into the first ferroelectric material layer; a second ferroelectric material layer is formed, and a second implanting process is performed to implant a second dopant (different form the first dopant) into the second ferroelectric material layer; the above processes may be repeated for a plurality of times to form a plurality of doped ferroelectric layers including different ferroelectric materials and/or dopants. In yet another embodiments, a ferroelectric material structure including one or more ferroelectric material layers may be firstly formed, thereafter, a plurality of implanting processes are performed to implant different dopants into different portions of the ferroelectric material structure. In some other embodiments, instead of using doping processes to form different doped ferroelectric layers, the ferroelectric structure 102 may be formed by a plurality of suitable deposition process, so as to form a plurality of ferroelectric layers including different ferroelectric materials.

In the embodiments of the disclosure, the ferroelectric structure utilizes at least two different ferroelectric materials with different properties, so as to tune the overall property of the ferroelectric structure, thereby enhancing device performance of the ferroelectric device. On the other hand, the flexibility in designing device performance of the ferroelectric device is also improved.

In accordance with some embodiments of the disclosure, a ferroelectric memory device includes a first conductive region, a second conductive region and a ferroelectric structure. The second conductive region is disposed over the first conductive region. The ferroelectric structure includes a plurality of different ferroelectric materials stacked between the first conductive region and the second conductive region.

In accordance with alternative embodiments of the disclosure, a ferroelectric memory device includes a substrate, a gate electrode and a ferroelectric structure. The substrate has a source region and a drain region. The gate electrode is disposed over the substrate and between the source region and the drain region. The ferroelectric structure is disposed over the substrate and includes a ferroelectric base material doped with a plurality of different types of dopants.

In accordance with some embodiments of the disclosure, a method of forming a ferroelectric memory device includes the following processes. A first conductive region is formed in or on a substrate. A ferroelectric structure is formed over the first conductive region, and the ferroelectric structure is formed of a plurality of different ferroelectric materials. A second conductive region is formed on the ferroelectric structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A ferroelectric memory device, comprising:
a dielectric layer;
a first conductive region;
a second conductive region over the first conductive region; and
a ferroelectric structure, comprising a plurality of different ferroelectric materials stacked between the first conductive region and the second conductive region, wherein the ferroelectric structure comprises a plurality of ferroelectric layers, wherein the second conductive region and the ferroelectric structure are embedded in the dielectric layer, and the second conductive region is spaced apart from the dielectric layer by the ferroelectric structure.

2. The ferroelectric memory device of claim 1, wherein the plurality of different ferroelectric materials have different properties, and the properties include one or more of remanent polarization, saturation polarization, coercive field, loop squareness, grain size and interface property.

3. The ferroelectric memory device of claim 1, wherein the ferroelectric structure comprises a first ferroelectric layer and a second ferroelectric layer disposed on first ferroelectric layer, and the second ferroelectric layer is spaced apart from the dielectric layer by the first ferroelectric layer.

4. The ferroelectric memory device of claim 3, wherein the first ferroelectric layer has a higher polarization value and higher coercive field than those of the second ferroelectric layer.

5. The ferroelectric memory device of claim 3, wherein the first ferroelectric layer has a higher loop squareness and lower remanent polarization than those of the second ferroelectric layer.

6. The ferroelectric memory device of claim 3, wherein the first ferroelectric layer comprises a first ferroelectric material that has a smaller grain size than a second ferroelectric material of the second ferroelectric layer, and a remanent polarization of the first ferroelectric material is less than a remanent polarization of the second ferroelectric material.

7. The ferroelectric memory device of claim 1, wherein a topmost ferroelectric layer among the ferroelectric layers serves as a diffusion barrier layer preventing metal diffusion from the second conductive region to the ferroelectric structure.

8. The ferroelectric memory device of claim 7, wherein the second conductive region is a gate electrode of a transistor, the gate electrode is in contact with the topmost ferroelectric layer, and the first conductive region is a channel region of the transistor.

9. The ferroelectric memory device of claim 7, wherein the topmost ferroelectric layer is in contact with the second conductive region, and the topmost ferroelectric layer is not in contact with the dielectric layer.

10. The ferroelectric memory device of claim 1, wherein the ferroelectric memory device has a product specification defining allowable ranges of various properties of the ferroelectric structure;
a first ferroelectric material of the ferroelectric structure has a first property that meets the product specification, while a second property of the first ferroelectric material is out of the product specification; and
a second ferroelectric material of the ferroelectric structure is used to compensate for the first ferroelectric material, such that the second property of the ferroelectric structure meets the requirement of the product specification.

11. A ferroelectric memory device, comprising:
a substrate, having a source region and a drain region;
a dielectric layer disposed on the substrate, the dielectric layer covering the source region and the drain region;
a gate stack, comprising a gate insulator, a ferroelectric structure disposed on the gate insulator and a gate electrode disposed on the ferroelectric structure, the gate stack being embedded in the dielectric layer, and the gate stack being disposed over the substrate and between the source region and the drain region, wherein the gate electrode is spaced apart from the dielectric layer by the ferroelectric structure, a top surfaces of the dielectric layer substantially levels with a top surface of the gate electrode and top ends of the ferroelectric structure.

12. The ferroelectric memory device of claim 11, wherein the ferroelectric structure comprises a ferroelectric base material doped with a plurality of different types of dopants, and the ferroelectric base material comprises hafnium oxide, and the plurality of different types of dopants are selected from a group consisting of Si, Zr, La, Al.

13. The ferroelectric memory device of claim 12, wherein the plurality of different types of dopants comprises a first dopant concentrated in a bottom portion of the ferroelectric structure, a second dopant concentrated in a middle portion of the ferroelectric structure and a third dopant concentrated in an upper portion of the ferroelectric structure.

14. The ferroelectric memory device of claim 11, wherein the ferroelectric structure includes a first doped ferroelectric layer and a second doped ferroelectric layer having different dopants therein, and an interface is existed between the first doped ferroelectric layer and the second doped ferroelectric layer.

15. The ferroelectric memory device of claim 11, wherein the ferroelectric structure is configured to have a target polarization value and a target coercive field, and the ferroelectric structure comprises:
a first doped ferroelectric layer having a first polarization value less than the target polarization value and a first coercive field less than the target coercive field; and
a second doped ferroelectric layer having a second polarization value larger than the target polarization value and a second coercive field larger than the target coercive filed.

* * * * *